Figure 1:
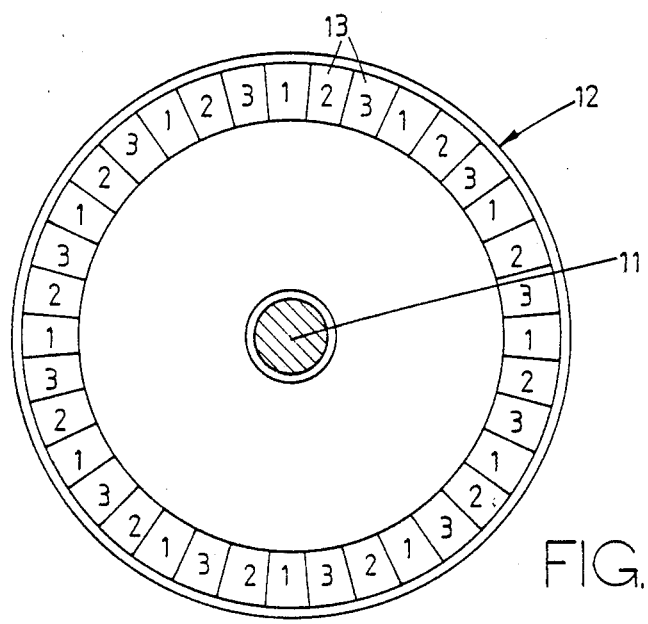

United States Patent [19]

Extance et al.

[11] Patent Number: 4,774,494
[45] Date of Patent: Sep. 27, 1988

[54] POSITION ENCODER EMPLOYING THREE OR MORE COLORS

[75] Inventors: Philip Extance; Roger J. Hazelden, both of Solihull, United Kingdom

[73] Assignee: Lucas Industries public limited company, Birmingham, England

[21] Appl. No.: 888,075

[22] Filed: Jul. 22, 1986

[30] Foreign Application Priority Data

Aug. 1, 1985 [GB] United Kingdom ............... 8519384

[51] Int. Cl.⁴ .......................................... H03M 1/30
[52] U.S. Cl. ................................. 341/6; 250/231 SE; 341/11; 341/13
[58] Field of Search ...................... 340/347 P, 347 M; 250/231 SE; 235/465

[56] References Cited

U.S. PATENT DOCUMENTS

| 2,656,106 | 10/1953 | Stabler | 340/347 P |
| 3,671,722 | 6/1972 | Christie | 235/465 X |
| 3,738,504 | 6/1973 | Vail et al. | 340/347 M X |
| 3,836,958 | 9/1974 | McMurtry | 250/227 X |
| 3,967,271 | 6/1976 | Day | 340/347 P |
| 4,172,554 | 10/1979 | Clarinval et al. | 235/465 X |
| 4,228,396 | 10/1980 | Palombo et al. | 318/313 X |

Primary Examiner—I. J. Sloyan
Attorney, Agent, or Firm—Nixon & Vanderhye

[57] ABSTRACT

An incremental position encoder comprising a first member arranged for movement with a second member the movement of which is to be monitored, a plurality of light transmissive or reflective elements of three distinct colors, said elements being arranged in a row on said first member, and the elements being arranged in the row in a repeating sequence of said three colors, a light source directing light to said elements and a color sensitive light detector for receiving light transmitted by, or reflected from said elements, said color sensitive detector being arranged to produce, at any given instant, one of three distinct outputs dependant upon the color of the three available, of the element which is at that instant transmitting or reflecting light from the source to the detector.

24 Claims, 3 Drawing Sheets

POSITION ENCODER EMPLOYING THREE OR MORE COLORS

This invention relates to an incremental position encoder for use in monitoring rotation of a component, for example the crankshaft of a reciprocating piston internal combustion engine.

It is known to monitor the position speed and direction of rotation of a shaft by means of an optical incremental position encoder comprising a disc which rotates with the shaft and has around its periphery a series of identical, equiangularly spaced apertures. First and second light sources spaced apart angularly around the axis of rotation of the disc direct light through the apertures of the disc to respective first and second similarly spaced detectors. The detectors each produce an output, as the disc rotates, in the form of a series of pulses which can be represented, for the purposes of the associated electronics circuitry, as a sine wave. It is usual to arrange the detectors such that their outputs are in quadrature. The rotational position of the disc, and therefore the shaft, can be determined by counting the output pulses of one of the detectors (commencing at a known datum which may for example be an additional aperture in the disc) the pulse count being representative of the angular position of the disc in relation to the datum. The speed of rotation of the disc, and therefore the shaft, can be determined by counting pulses within a given time span, and the rotational direction can be determined from the phase difference of the output of the two detectors. It is also known in such a system to use remotely positioned light sources and detectors, and to conduct light to and from the disc by means of light guides. The known arrangement described above is disadvantageous in that it requires two detectors and associated light sources, and also in that the associated electronic circuitry which is needed to interpret the outputs of the detectors is relatively complex. It is an object of the present invention to provide an incremental position encoder wherein these disadvantages are minimised.

In accordance with the present invention there is provided an incremental position encoder comprising a first member arranged for movement with a second member the movement of which is to be monitored, a plurality of light transmissive or reflective elements of three distinct colours, said elements being arranged in a row on said first member, and the elements being arranged in the row in a repeating sequence of said three colours, a light source directing light to said elements, a colour sensitive light detector for receiving light transmitted by, or reflected from said elements, said colour sensitive detector being arranged to produce, at any given instant, one of three distinct outputs dependant upon the colour, of the three available, of the element which is at that instant transmitting or reflecting light from the source to the detector, and means for analysing the output from the detector to determine one or more parameters of the movement of said second member.

Conveniently said first member is a disc arranged for rotation in response to movement of said second member, said elements being arranged on the disc in a circular row having its centre on the axis of rotation of the disc.

Conveniently said second member is a rotatable shaft and said disc rotates therewith.

It will be recognised that utilizing an incremental position encoder as set out in the preceding paragraph there will be a repeating sequence of three distinct outputs from the detector as the disc rotates. Simply by counting the individual output pulses, without discriminating between them, it is possible to determine (by reference to a known datum) the rotational position of the disc, and therefore of the shaft being monitored. By counting pulses within a given period of time the rotational speed of the disc and therefore the shaft can be determined, and the sequence in which the three distinct outputs occur is representative of the direction of rotation of the disc and therefore the shaft. It will be recognised therefore that by comparison with the prior art discussed above, the present position encoder can achieve exactly the same monitoring of the rotational position, speed, and direction of a shaft but without the need to employ a pair of light sources and associated detectors, and particularly in relation to the determination of the direction of rotation, the electronic circuitry which interprets detector output is considerably more simple.

Figures 2, 3:
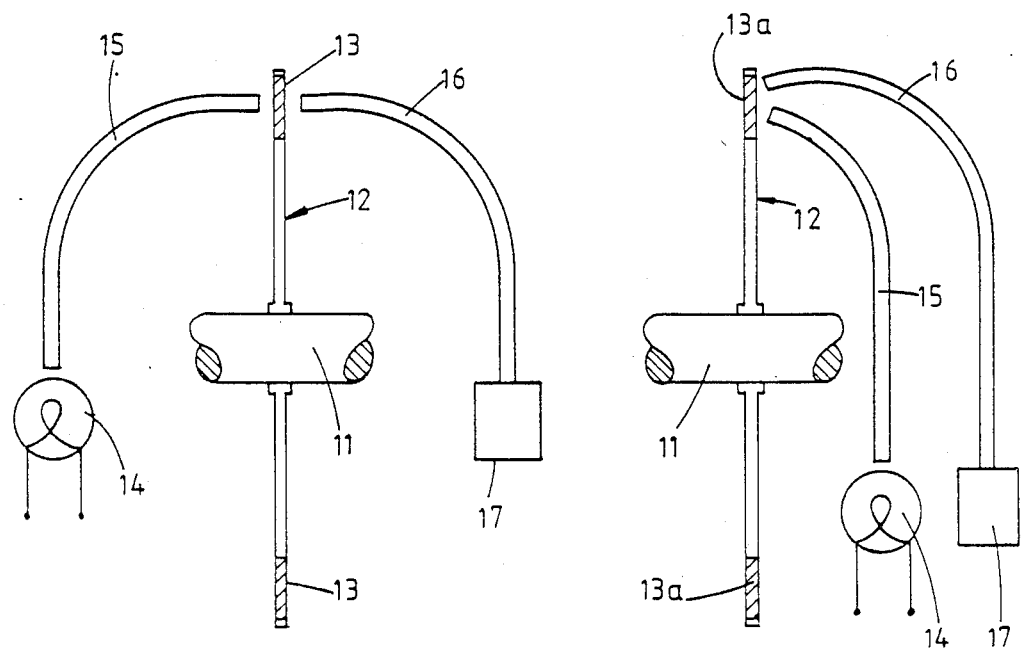
Figure 4:
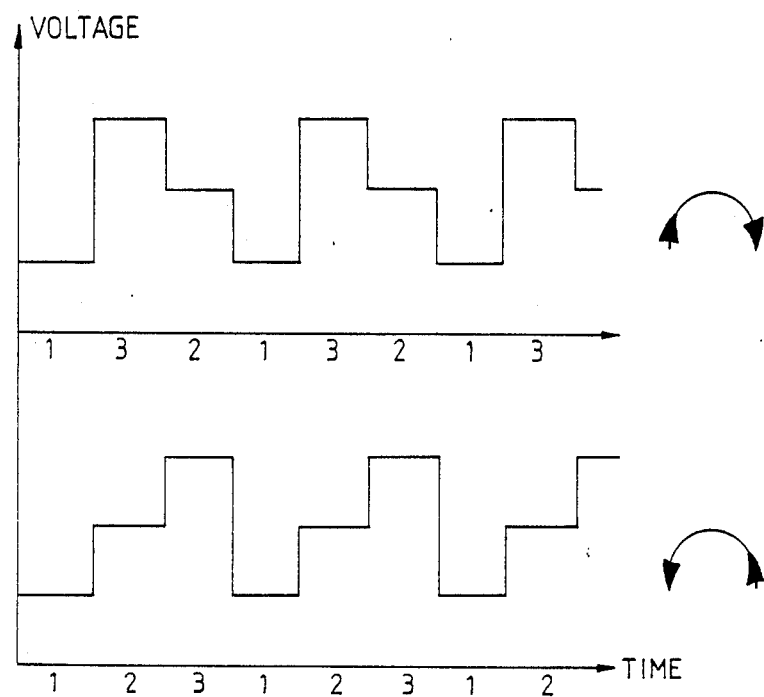
Figure 5:
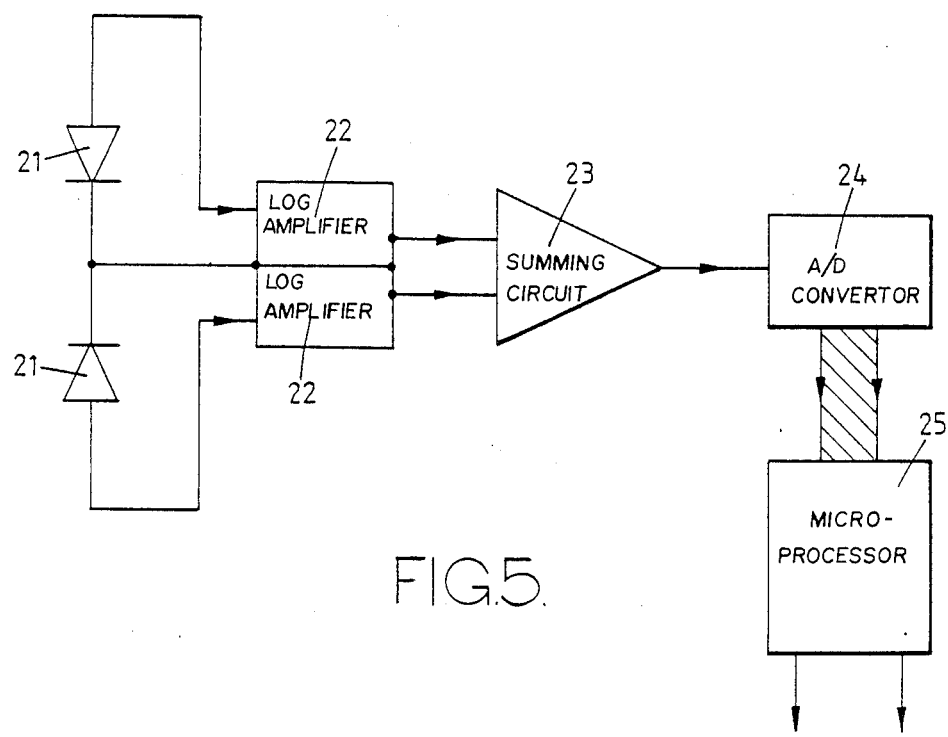
Figure 6:
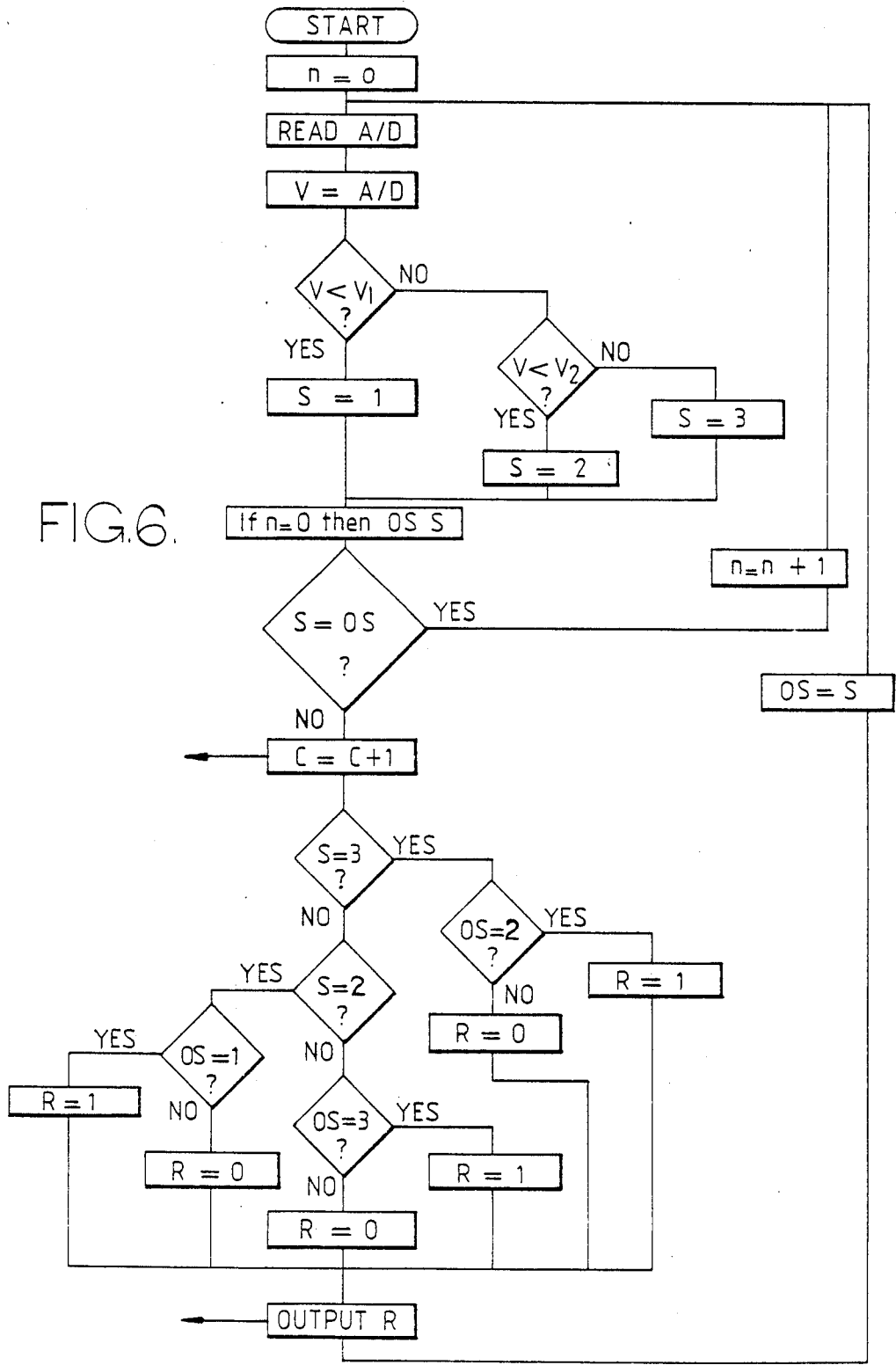

One example of the invention illustrated in the accompanying drawings wherein in:

FIG. 1 is a diagramatic view of an encoder disc,

FIG. 2 is a diagramatic view, in a plane at right angles to the plane of FIG. 1, illustrating the disc together with a light source and a detector, FIG. 3 is a view similar to FIG. 2 of a modification, FIG. 4 is a composite graph illustrating an output wave form of the detector of FIG. 2 or FIG. 3 for both alternative directions of rotation of the disc, FIG. 5 is a block circuit diagram of a microprocessor based encoder, and FIG. 6 is a flow diagram illustrative of the operation of the microprocessor of FIG. 5.

Referring to the drawings, the shaft, the rotational position, rotational speed, and rotational direction of which are to be determined, is shown at 11. Rigidly secured to the shaft 11 for rotation therewith is an encoder disc 12. The disc is shown mounted upon the shaft for convenience and simplicity, but it is to be understood that this is not essential provided that the disc is rotated by the shaft to be monitored at a speed which is directly proportional to the shaft rotational speed, and in a direction which is determined by the rotational direction of the shaft.

The disc 12 carries, around it periphery, a plurality of coloured elements 13 of three distinct colours. The elements 13 can be light transmissive as shown in FIG. 2, or can be light reflective elements 13a as shown in FIG. 3. The elements 13 are arranged in a circular row having its centre on the axis of rotation of the disc and are arranged in a repeating sequence of the three colours. The angular spread, and the positioning of the elements 13 is such that the sequence of three colours is a complete sequence around the periphery of the disc. In FIG. 1 the three colours are indicated by the numbers 1, 2 and 3 respectively and the sequence repetition is clear from FIG. 1.

Considering initially the case in which the elements 13 are light transmissive, then it can be seen with reference to FIG. 2 that light is conducted to one face of the disc 12, in the region of the elements 13, from a light source 14 by a first light guide 15. The guide 15 permits the light source 14 to be at a location remote from the disc 12. Light from the guide 15, transmitted by an element 13, is received by a second light guide 16 and is conducted thereby to a colour sensitive detector 17. The guide 16 permits the detector 17 to be at a remote location.

The detector 17 which comprises a light sensor and associated electronics circuitry, produces an output voltage which is proportional to the wavelength of the light incident upon the sensor, and which is independant, within predetermined limits, of the intensity of the light incident upon the sensor. The wavelength of the light incident upon the sensor of the detector 17 will be determined by the colour of the element 13 through which the light passes, and thus as the disc rotates the detector will produce a series of pulses in a sequence of three different voltage levels. Simply by counting the pulses from a fixed datum it is possible to determine the rotational position of the disc, and therefore the shaft, in relation to the datum. The speed of rotation can be calculated by counting the number of output pulses, irrespective of their voltage level, within a given time period, and the direction of rotation of the disc, and therefore the shaft, can be recognised by the sequence of the output pulses. FIG. 4 assumes that colour 1 will give an output pulse at a first voltage level, colour 2 will give an output pulse at a second, higher voltage level and that colour 3 will give an output pulse at a third, even higher voltage level. The sequence, or train, of pulses for counter clockwise rotation of the disc is shown in the lower half of FIG. 4, and the equivalent sequence for clockwise rotation is shown in the upper half of FIG. 4. The difference in the two sequences is quite clearly shown, and can be recognised by relatively simple electronic circuitry.

FIG. 3 shows a modification of the arrangement shown in FIG. 2 in which the elements 13a are reflective rather than transmissive. A light source 14 supplies light to the elements 13a by way of a first light guide 15 and light reflected from an element 13a is collected by a second light guide 16 and conducted to a detector 17. The light source and detector are exactly as described with reference to FIG. 2, but because the elements 13a are reflective the guides 15, 16 terminate at the same face of the elements 13a rather than at opposite faces of the elements 13 as is the case in the transmissive version shown in FIG. 2.

In a practical embodiment of the arrangement illustrated diagramatically in FIG. 2 the detector 17 includes a semi-conductor colour sensor manufactured by the Sharp Corporation Electronics Components Group and sold under their type number PD-150/151. It is believed that the colour sensor is a semi-conductor package comprising a pair of photodiodes with their cathodes interconnected. One of the photodiodes is particularly sensitive to short wavelengths of light while the other is particularly sensitive to long wavelengths. The ratio of the outputs of the two diodes is thus related to the wavelength of the incident light and is substantially independent of the intensity of the incident light. The output of the two photodiodes of the semi-conductor package can be interpreted either by an analog circuit, or by a microprocessor circuit. In the analog circuit the outputs of the two photodiodes are processed by respective function generators of the type having a logarithmic transfer characteristic, and the outputs of the two function generators are fed to a summing circuit the output of which produces an output at one of three discrete voltage levels dependant upon which of the three colours of light is incident on the sensor. In the microprocessor arrangement the outputs of the two photodiodes are fed to respective analog to digital convertors which in turn feed respective inputs of a microprocessor. The microprocessor is programmed to produce an output signal at any one of three discrete levels dependant upon the colour of the light incident upon the sensor.

The outputs required from the device are, for example, a pulse for every increment of rotation of the disc, and also a signal denoting direction of rotation. Interpretation of the three levels from the colour-sensing circuit can be most conveniently performed by a microprocessor, which may be the same as that employed to determine the colour. The microprocessor will be programmed to produce an output pulse each time the colour changes, for example, from colour 1 to colour 2, these pulses can be counted to determine the amount of rotation.

Allowance must be made in the program for changes in the exact levels produced by the three colours due, for example, to ageing effects in the coloured elements.

The direction of rotation is sensed by comparing the current colour with the previous one. If the colour has changed from 1 to 3, from 3 to 2 or from 2 to 1, the direction of rotation is clockwise, while if the colour has changed from 1 to 2, from 2 to 3 or from 3 to 1 the direction of rotation is counter clockwise. The circuit can then provide an appropriate direction signal. If the level is outside the allowable limits for the three colours, there is a fault in the system, and an appropriate output can be produced.

FIGS. 5 and 6 illustrate a further processing arrangement which may be considered to be a hybrid of the analog and microprocessor versions described above in general terms. The arrangement now to be described with reference to FIGS. 5 and 6 is the currently preferred processing arrangement.

As can be seen from FIG. 5 the output from each of the photodiodes 21 is passed to a respective log amplifier 22 the resultant outputs of which are passed to a summing circuit 23. The output of the circuit 23 will be a voltage level dependent upon which of the three colours of light is incident upon the photodiodes 21 and this output signal is fed an analog to digital converter 24. The converter 24 produces an 8 bit output which is applied to a microprocessor 25, conveniently a 6809 processor.

The operation of the processor is indicated by the flow diagram shown in FIG. 6. The 8 bit digital output of the converter 24 represents one of three possible states corresponding to the colours 1, 2 and 3 of the elements 13 of the disc 12. Let us assume that the colour state previously interpreted by the microprocessor 25 was colour 2, then a variable OS (old state) is set to the value 2. In the next pass through the program of the microprocessor 25 the output from the converter 24 is read and a variable V is set to the current output state from the microprocessor (1, 2 or 3). V is then compared with a reference value V1 generated within the microprocessor, V1 being a value between state 1 and state 2. If, during the comparison of V with V1, V is found to be less than V1 then the current output from the converter 24 must be state 1 and a variable S (current state) is set to 1. However, if V is found to be not less than V1 then V is compared with a second state V2 also generated by the microprocessor, V2 being a state between state 2 and state 3. If V is found to be less than V2 then the current state output from the converter 24 must be state 2 and variable S is set to 2. If V is found to be not less than V2 then the current state output by the converter 24 must be state 3 and S is set to 3. The value of S is then compared with the value of OS and if S and OS are found to be equal then control is passed back to the commencement of the program and the output from the converter 24 is again read and the same comparisons of V with V1 and V2 are performed.

In order to avoid spurious signals due to an indeterminate state of variable OS the program is arranged to commence by setting to zero a counter (variable n) within the processor.

While the value of n is zero the processor interprets the colour as described above to ascribe a value to S and then OS is set to be equal to S. Next OS is compared with S and since they are equal the counter n is incremented and control is passed back to read the output from the convertor 24 again. However n is no longer equal to zero and so the step of setting OS equal to S does not occur. Thus after this start proceedure, 1 which avoids the problems of an undeterminate state of OS at the start of operation, further iterations are as described above.

When it is found that S is not equal to CS then clearly the position of the disc 12 has changed and the colour of the element 13 adjacent the photodiodes 21 must be either colour 1 or colour 3. This change is indicative of the fact that the disc 13 has moved, and thus a counter C is incremented. A large number of passes through this part of the program will take place in the time taken for one colour change to occur, and thus incrementing of the counter occurs each time a different element 13 is adjacent the photodiodes 21. It will be recognised therefore that the actual count of counter C in unit time can be used to indicate the speed of rotation of the disc 12.

After incrementation of the counter C the value of variable S is compared with the three known possible values (1, 2 and 3) to determine the direction of rotation. The first comparison checks to see whether S is equal to 3. If S is equal to 3 then the microprocessor checks to see whether OS is equal to 2. If S equals 3 and OS equals 2 then the direction of rotation must be counterclockwise, and a variable R (rotation) is set to 1. However, if S equals 3 and OS is not equal to 2 then the direction of rotation cannot be counterclockwise and thus since some rotation has occurred in order to reach this point in the programme, the rotation must be clockwise and R is set to zero. In the event that S is not equal to 3 then a check is made to see whether S equals 2. If S equals 2 then a check is made to see whether OS equals 1, and if S equals 2 and OS equals 1 then again the rotation must be counterclockwise and R is set to 1. However, if S equals 2 and OS is not equal to 1 then the direction of rotation must be clockwise and R is set to zero.

If S is found to be not equal to 3 and not equal to 2 then it must be equal to 1, and thus all that is necessary is to determine whether OS equals 3. If OS equals 3 then since S equals 1 rotation must be counterclockwise rotation and thus R is set to 1. It follows therefore that if OS is not equal to 3 then rotation must be in a clockwise direction and thus R is set to zero. The resultant value of R (either 1 or zero) is then output as an indication of the direction of rotation of the disc 12 and the value of S is carried back to the commencement of the program as the new value of OS. Thus as a last stage OS is set to equal S and the program is rerun from its reading of the converter 24.

As with the previous operating procedures described in general above allowance will be made in the program for changes in the exact voltage levels produced by the three colours due, for example, to ageing effects in the coloured elements. Similarly, the program will include fault condition determination whereby a fault warning is given in the event that the voltage levels represented by the output from the converter 24 are outside the allowable limits for the chosen three colours.

It is desirable that the light source has a wide spectral range, and a filament lamp is very suitable. However, a multi-LED configuration utilising LEDs of differing colours may be used.

There are no opaque regions between the individual elements 13, and thus during normal operation of the encoder there will always be light incident upon the sensor of the detector 17. Ttus failure of the light source or breakage of one or other of the fibres 15, 16 will immediately be detected by the lack of light at the sensor of the detector 17. This is an additional advantage over the prior art arrangement which utilises two sources and two detectors, and wherein the disc has a circular row apertures interspaced with opaque regions since in that arrangement there are times when, during normal operation, no light will be received by either detector. Thus the recognition of the failure of one or other of the light sources, or one or other of the associated light guides, is more difficult.

It will be recognised that it is desirable to use colours of widely different wavelengths for the three colours of the elements 13 or 13a. Thus red, green and blue would be particularly suitable, since red and blue are at opposite ends of the visible spectrum and green is around the mid-point between the wavelengths of red and blue light. However, as an alternative red, yellow and blue would also be suitable.

The term "light guide" as used above is intended to include optical fibres, optical cables (bundles of light conductive glass or plastics filaments), and guides in the form of solid rods of light conductive material.

While light guides have been used in the above described embodiments for guiding light to and from the colour elements, it is to be understood that it would be possible in some applications to dispense with the light guides and to mount the light source and the detector closely adjacent the colour elements. The detector and source will be on opposite sides of the colour elements where the elements are transmissive but on the same side where the elements are reflective.

The above described embodiments are all in the the form of a rotary encoder but it is to be understood that other movements of a component, for example rectilinear or arcuate reciprocating movement can be catered for.

We claim:

1. An incremental position encoder comprising a first member arranged for movement with a second member the movement of which is to be monitored, a plurality of light transmissive elements of three distinct colours, said elements being sequentially arranged on said first member in a repeating sequence of said three colours, a light source directing light to said elements, a colour sensitive light detector for receiving light transmitted by said elements, said colour sensitive detector being arranged to product, at any given instant, one of three distinct outputs dependent upon the colour of the element which is at that instant transmitting light from the source to the detector, and means for analysing the output from the detector to determine one or more parameters of the movement of said second member.

2. An encoder as claimed in claim 1 wherein said first member is a disc arranged for rotation in response to movement of said second member, said elements being arranged on the disc in a circular row having its centre on the axis of rotation of the disc.

3. An encoder as claimed in claim 2 wherein said second member is a rotatable shaft and said disc rotates therewith.

4. An encoder as claimed in claim 3 wherein said disc is carried by said shaft.

5. An encoder as claimed in claim 1 wherein the output from the detector is analysed by a microprocessor to determine the speed and direction of movement of said second member.

6. An encoder according to claim 1 wherein the output of said detector is analysed to determine the position of said second member relative to a datum.

7. An encoder according to claim 1 wherein said first member comprises an element rotatable in response to movement of said second member, the output of said detector being analysed to determine the speed and direction of movement of said second member.

8. An encoder according to claim 7 wherein the output of said detector is analysed to determined the speed, direction and position of said second member.

9. An incremental position encoder comprising a first member arranged for movement with a second member the movement of which is to be monitored, a plurality of light reflective elements of three distinct colours, said element being sequentially arranged on said first member in a repeating sequence of said three colours, a light source directing light to said elements, a colour sensitive light detector for receiving light reflected from said elements, said colour sensitive detector being arranged to produce, at any given instant, one of three distinct outputs dependent upon the colour of the element which is at that instant reflecting light from the source to the detector, and mean for analysing the output from the detector to determine one or more parameters of the movement of said second member.

10. An encoder as claimed in claim 9 wherein said first member is a disc arranged for rotation in response to movement of said second member, said elements being arraned on the disc in a circular row having its centre on the axis of rotation of the disc.

11. An encoder as claimed in claim 10 wherein said second member is a rotatable shaft and said disc rotates therewith.

12. An encoder as cliamed in claim 11 wherein said disc is carried by said shaft.

13. An encoder as claimed in claim 9 wherein the output from the detector is analysed by a microprocessor to determine the speed and direction of movement of said second member.

14. An encoder according to claim 9 wherein the output of said detector is analysed to determine the position of said second member relative to a datum.

15. An encoder according to claim 9 wherein said first member comprises an element rotatable in response to movement of said second member, the output of said detector being analysed to determine the speed and direction of movement of said second member.

16. An encoder according to claim 15 wherein the output of said detector is analysed to determine the speed, direction and position of said second member.

17. An encoder according to claim 1 wherein said first member comprises an element rotatable in response to movement of aid second member, the output of said detector being analysed to determine the speed of said second member.

18. An encoder according to claim 1 wherein said first member comprises an element rotatable in response to movement of said second member, the output of said detector being analysed to determine direction of movement of said second member.

19. An encoder according to claim 9 wherein said first member comprises an element rotatable in response to movement of said second member, the output of said detector being analysed to determine direction of movement of said second member.

20. An encoder according to claim 9 wherein said first member comprises an element rotatable in response to movement of said second member, the output of said detector being analyzed to determine the speed of said second member.

21. An incremental position encoder comprising:
a first member coupled for substantially continuous repetitive movements along a predetermined path to a second member, the movement of which is to be monitored;
a plurality of machine readable elements of at least three distinctly different but detectable properties a, b, c, said elements being sequentially arranged on said first member in a regularly repeating completed sequence abcabcabc . . . abc;
a single detector means disposed fixedly with respect to said first member and arranged to monitor the passage thereby of said elements, said detector means providing a distinctly recognizable different outputs signal corresponding to each of said distinctly different properties; and
signal analyzing means connected to receive the resulting sequence of said different output signals and to determine therefrom at least the movement direction of said second member.

22. An incremental position encoder as in claim 21 wherein said signal analyzer means also determines the movement speed of said second member.

23. An incremental position encoder as in claim 22 wherein said signal analyzer means also determines the instantaneous position of said second member with respect to a predetermined index location thereof.

24. An incremental position encoder as in claim 21 wherein said signal analyzer means also determines the instantaneous position of said second member with respect to a predetermined index location thereof.

* * * * *